United States Patent
Lin et al.

(10) Patent No.: US 6,882,037 B2
(45) Date of Patent: Apr. 19, 2005

(54) DIE PADDLE FOR RECEIVING AN INTEGRATED CIRCUIT DIE IN A PLASTIC SUBSTRATE

(75) Inventors: Wei-Feng Lin, Hsinchu (TW); Wei-Chi Liu, Pingtung (TW); Chung-Ju Wu, Kaohsiung (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 332 days.

(21) Appl. No.: 10/213,077

(22) Filed: Aug. 7, 2002

(65) Prior Publication Data

US 2004/0027814 A1 Feb. 12, 2004

(51) Int. Cl.⁷ .............................................. H01L 23/48
(52) U.S. Cl. ...................................... 257/690; 257/692
(58) Field of Search ................................ 257/690, 692, 257/698, 676

(56) References Cited

U.S. PATENT DOCUMENTS

2004/0027814 A1 * 2/2004 Lin et al. .................... 361/768

* cited by examiner

Primary Examiner—Mark V. Prenty
(74) Attorney, Agent, or Firm—Birch, Stewart, Kolasch & Birch, LLP

(57) ABSTRACT

A die paddle for receiving an integrated circuit die in a plastic substrate. The die paddle is defined by a copper film on the plastic substrate and comprises a plurality of via holes through the plastic substrate, a plurality of opening through the copper film, and a gold-containing ring formed on the peripheral portion of the copper film. The outermost openings (and/or the outermost via holes) and the gold-containing ring are separated by a distance of about 1 to about 20 mils.

18 Claims, 3 Drawing Sheets

US 6,882,037 B2

DIE PADDLE FOR RECEIVING AN INTEGRATED CIRCUIT DIE IN A PLASTIC SUBSTRATE

BACKGROUND OF THE INVENTION

1. Field of the Invention

The present invention relates to plastic ball grid array (PBGA) packages and more particularly to a die paddle for receiving an integrated circuit die in a plastic substrate thereby providing improved reliability and quality of the packages.

2. Description of the Related Art

An integrated circuit (IC) package is a structure used to electrically connect an IC die (chip) to a printed circuit board (PCB) or other host structure. Each die typically includes input/output (I/O) terminals arranged along a peripheral edge of the die. After the die is mounted on a package, the I/O terminals are electrically connected to bonding pads formed on the package using, for example, wire bond techniques. The package typically includes conductive lines electrically connected to external contacts such as, for example, pins, leads, or solder bumps. When the package is mounted onto a PCB, electrical signals are transmitted between the PCB and the die through these external contacts.

A standard PBGA package includes a plastic substrate having a die paddle thereon and an integrated circuit die mounted on the die paddle. The package further includes inner fingers and outer fingers formed on the upper surface of the plastic substrate.

FIG. 1 is a top view of a plastic substrate 10 having a die paddle 16 comprising of a copper film 12 and a gold ring 14 formed on the peripheral portion of the copper film 12.

FIG. 2 is a top view of a die paddle in the plastic substrate according to the prior art. Via holes 18 through the substrate 10 are formed in an array arrangement. Openings 20 are formed through the copper film 12 and interposed in the via hole array. The outermost via holes 18 and the gold ring 14 are separated by a distance (d0) of about 30 to about 50 mils (1 mil=25.4 µm). A solder resist layer is then formed on the copper film 12 to fill the via holes 18 and the openings 20 so that the copper film 12 can be secured on the plastic substrate.

The outermost via holes 18 or the outermost openings 20 are not limited or restricted by a predetermined distance from the gold ring 14. Therefore, the copper film 12 or the solder resist layer tends to delaminate from the plastic substrate, adversely affecting package quality and reliability.

As a result, there are continuing efforts to further improve substrate and package designs to reduce the probability of delamination.

SUMMARY OF THE INVENTION

In view of the above disadvantages, an object of the invention is to provide an improved die paddle for receiving an integrated circuit die in a plastic substrate. According to the die paddle of the invention, the delamination problems can be eliminated, improving the package quality and reliability.

In accordance with one aspect of the invention, there is provided a die paddle for receiving an integrated circuit die in a plastic substrate.

The die paddle comprises:

a plurality of via holes through the plastic substrate;

a copper film attached to a predetermined portion of the plastic substrate and on the side walls of the via holes;

a plurality of openings through the copper film exposing the upper surface of the plastic substrate;

a solder resist layer formed on the copper film and filled in the via holes and the openings; and a gold-containing ring formed on the peripheral portion of the copper film;

wherein the outermost openings (and/or the outermost via holes) and the gold-containing ring are separated by a distance of about 1 to 20 mils. More preferably, they are separated by a distance of about 2 to 5 mils.

Furthermore, the gold-containing ring preferably includes a nickel ring and a gold ring.

Furthermore, both the solder resist layer and the plastic substrate consist of epoxy resin.

Also, the copper film can be square and formed on the central portion of the plastic substrate.

Furthermore, both the via holes and openings can be in array arrangements. Alternately, the via holes and openings can be randomly arranged.

BRIEF DESCRIPTION OF THE DRAWINGS

The preferred embodiment of the invention is hereinafter described with reference to the accompanying drawings in which.

DETAILED DESCRIPTION OF THE INVENTION

[First Embodiment]

Figure 1:
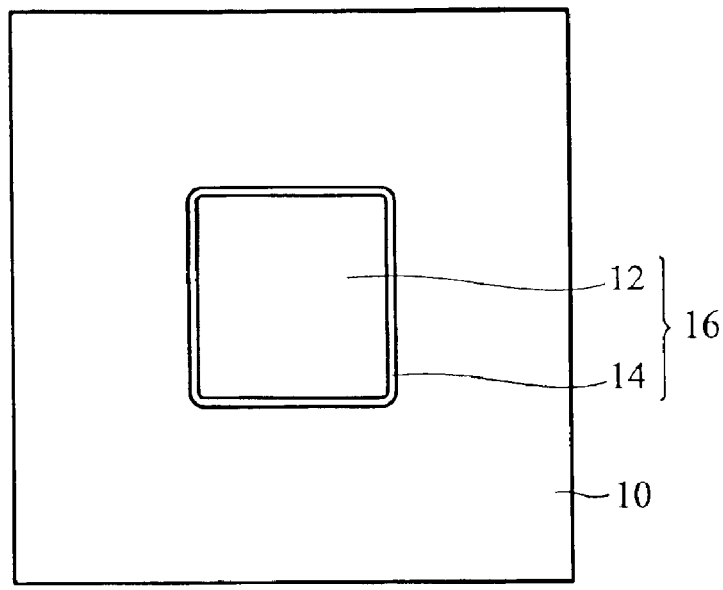
FIG. 1 is a top view of a plastic substrate having a die paddle according to the prior art.
Figure 2:
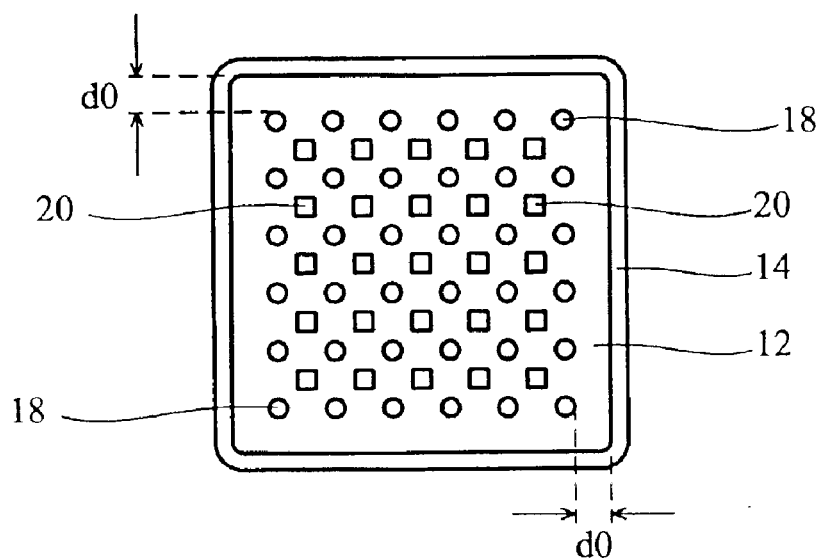
FIG. 2 is a top view of a die paddle in the plastic substrate according to the prior art.
Figure 3:
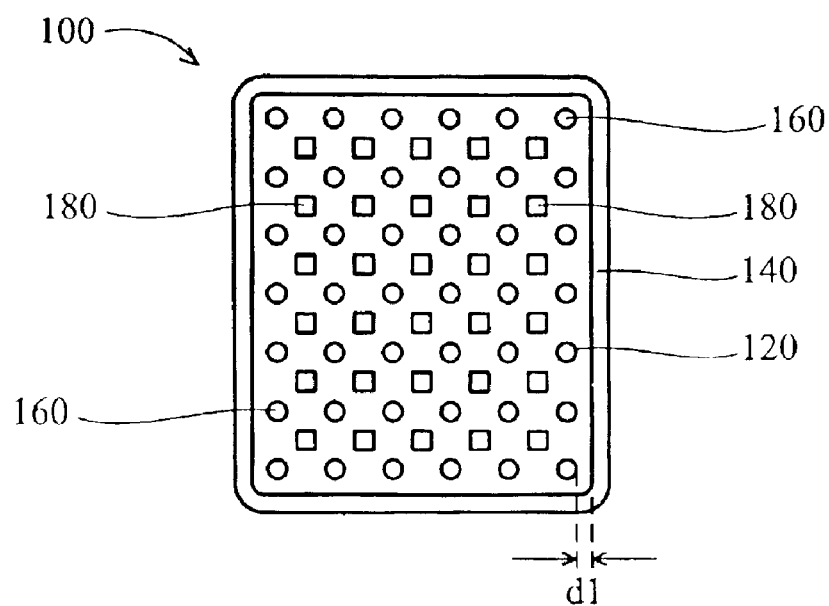
FIG. 3 is a top view of a die paddle in a plastic substrate according to the first embodiment of the invention.
Figure 4:
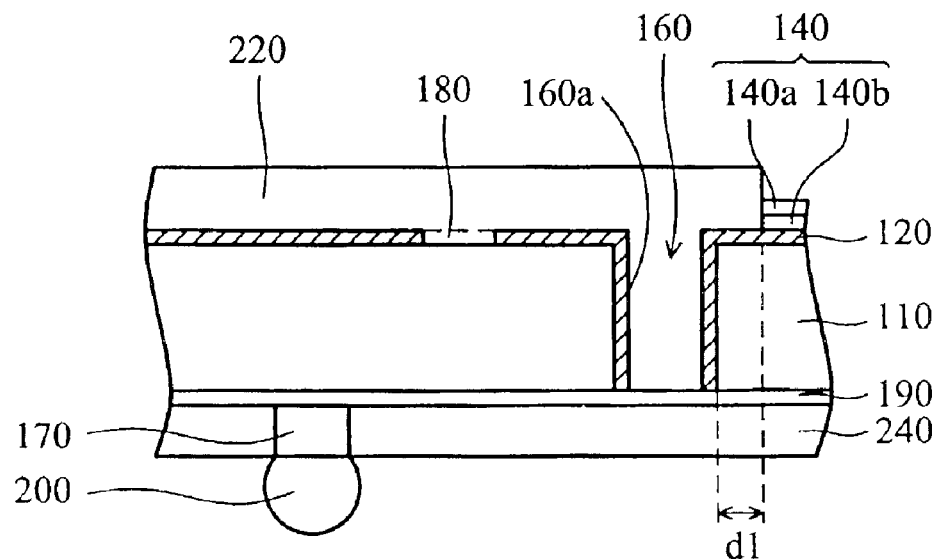
FIG. 4 is a cross-section of a part of the die paddle according to the first embodiment of the invention.

FIG. 3 and FIG. 4 show a square die paddle 100 in a plastic substrate 110 for receiving an integrated circuit die. The plastic substrate 110 is a plastic ball grid array substrate (PBGA substrate) and consists of epoxy resin.

The die paddle 100 includes a plurality of via holes 160, in an array arrangement, through the plastic substrate 110 and a copper film 120 attached to the central portion of the plastic substrate 110 and on the side walls 160a of the via holes 160 to electrically connect to the ground layer or the power layer. Also, the copper film 120 is formed on the plastic substrate 110 to define the die paddle region. In this embodiment, electrical signals can be transmitted from the integrate circuit die to the solder ball 200 through the copper film 120 in the via holes 160 and a conductive plug 170 in the solder resist 240.

The die paddle 100 further includes a plurality of openings 180, in an array arrangement, through the copper film 120 exposing the upper surface of the plastic substrate 110 and a solder resist layer 220 formed on the copper film 120 and filled in the via holes 160 and the openings 180. The solder resist layer 220 consists of epoxy resin so as to enhance adhesion between the solder resist layer 220 and the plastic substrate 110.

Furthermore, a gold-containing ring 140, consisting of nickel ring 140b and a gold ring 140a, is disposed on the peripheral portion of the copper film 120.

In this embodiment of the invention, the outermost via holes 160 and the gold-containing ring 140 are preferably separated by a distance (d1) of about 1 to about 20 mils, more preferably, 2 to 5 mils. All the outermost via holes 160 are arranged nearby the gold-containing ring 140 so that the delamination problems described above can be eliminated.

[Second Embodiment]

Figure 5:
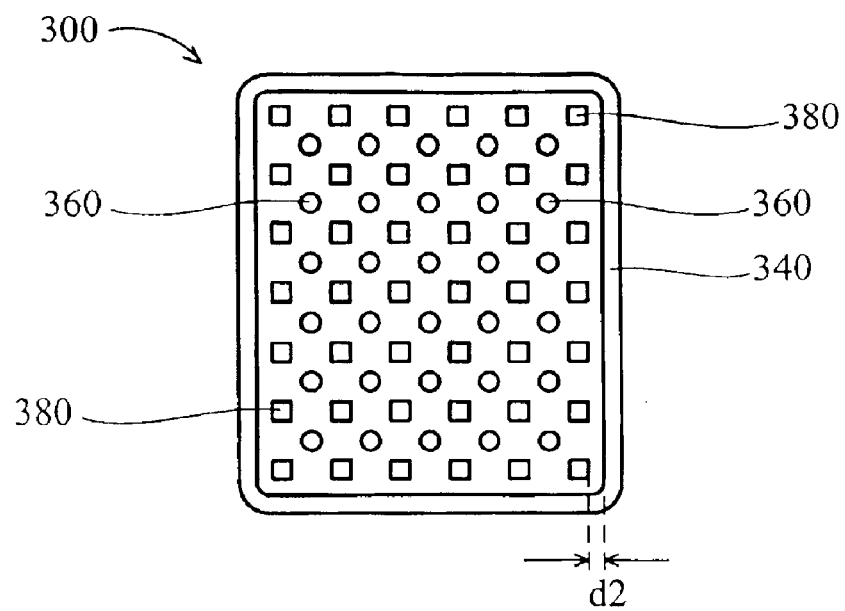
FIG. 5 is a top view of a die paddle in the plastic substrate according to the second embodiment of the invention.
Figure 6:
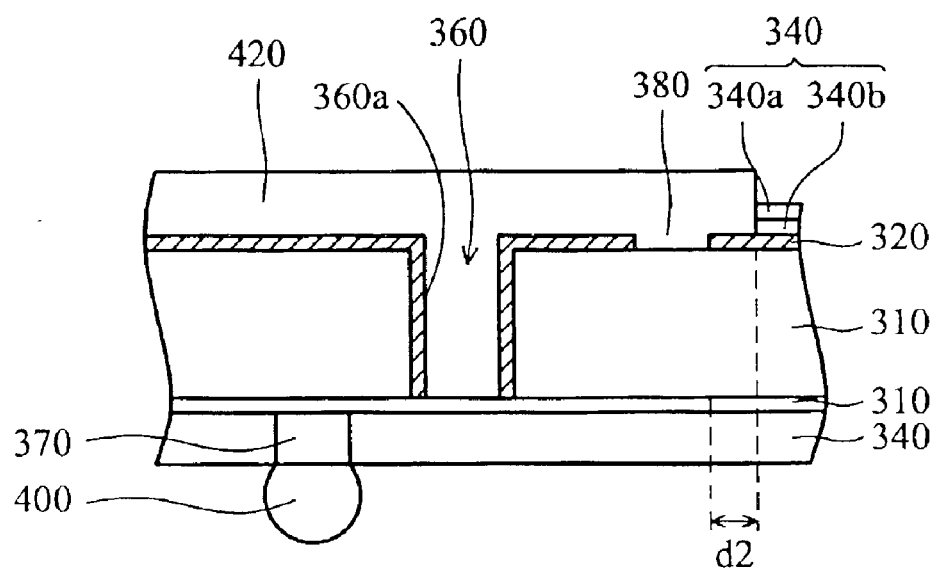
FIG. 6 is a cross-section of a part of the die paddle according to the second embodiment of the invention.

FIG. 5 and FIG. 6 show a square die paddle 300 in a plastic substrate 310 for receiving an integrated circuit die. The plastic substrate 310 is a plastic ball grid array substrate (PBGA substrate) and consists of epoxy resin.

The die paddle 300 includes a plurality of via holes 360, in an array arrangement, through the plastic substrate 310 and a copper film 320 attached to the central portion of the plastic substrate 310 and on the side walls 360a of the via holes 360 to electrically connect to the ground layer or the power layer. Also, the copper film 320 is formed on the plastic substrate 310 to define the die paddle region. In this embodiment, electrical signals can be transmitted from the integrate circuit die to the solder ball 400 through the copper film 320 in the via holes 360 and a conductive plug 370 in the solder resist 340.

The die paddle 300 further includes a plurality of openings 380, in an array arrangement, through the copper film 320 exposing the upper surface of the plastic substrate 310 and a solder resist layer 420 formed on the copper film 320 and filled in the via holes 360 and the openings 380. The solder resist layer 420 consists of epoxy resin so as to enhance adhesion between the solder resist layer 420 and the plastic substrate 310.

Furthermore, a gold-containing ring 340, consisting of nickel ring 340b and a gold ring 340a, is disposed on the peripheral portion of the copper film 320.

In this embodiment of the invention, the outermost openings 380 and the gold-containing ring 340 are preferably separated by a distance (d2) of about 1 to about 20 mils, more preferably, 2 to 5 mils. All the outermost openings 380 are arranged nearby the gold-containing ring 340 so that the delamination problems described above can be eliminated.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A die paddle for receiving an integrated circuit die in a plastic substrate, comprising:

a plurality of via holes through the plastic substrate;

a copper film attached to a predetermined portion of the plastic substrate and on the side walls of the via holes;

a plurality of openings through the copper film exposing the upper surface of the plastic substrate;

a solder resist layer formed on the copper film and filled in the via holes and the openings; and a gold-containing ring formed on the peripheral portion of the copper film;

wherein the outermost openings and the gold-containing ring are separated by a distance of about 1 to about 20 mils.

2. A die paddle for receiving an integrated circuit die in a plastic substrate as claimed in claim 1, wherein the outermost openings and the gold-containing ring are separated by a distance of about 2 to about 5 mils.

3. A die paddle for receiving an integrated circuit die in a plastic substrate as claimed in claim 1, further comprising a nickel ring between the gold-containing ring and the copper film.

4. A die paddle for receiving an integrated circuit die in a plastic substrate as claimed in claim 1, wherein the solder resist layer is an epoxy resin layer.

5. A die paddle for receiving an integrated circuit die in a plastic substrate as claimed in claim 1, wherein the plastic substrate comprises epoxy resin.

6. A die paddle for receiving an integrated circuit die in a plastic substrate as claimed in claim 1, wherein the copper film is square.

7. A die paddle for receiving an integrated circuit die in a plastic substrate as claimed in claim 1, wherein the via holes are formed in an array arrangement.

8. A die paddle for receiving an integrated circuit die in a plastic substrate as claimed in claim 1, wherein the openings are formed in an array arrangement.

9. A die paddle for receiving an integrated circuit die in a plastic substrate as claimed in claim 1, wherein the copper film is attached to the central portion of the plastic substrate.

10. A die paddle for receiving an integrated circuit die in a plastic substrate, comprising:

a plurality of via holes through the plastic substrate;

a copper film attached to a predetermined portion of the plastic substrate and on the side walls of the via holes;

a plurality of openings through the copper film exposing the upper surface of the plastic substrate;

a solder resist layer formed on the copper film and filled in the via holes and the openings; and a gold-containing ring formed on the peripheral portion of the copper film;

wherein the outermost via holes and the gold-containing ring are separated by a distance of about 1 to about 20 mils.

11. A die paddle for receiving an integrated circuit die in a plastic substrate as claimed in claim 10, wherein the outermost via holes and the gold-containing ring are separated by a distance of about 2 to about 5 mils.

12. A die paddle for receiving an integrated circuit die in a plastic substrate as claimed in claim 10, further comprising a nickel ring between the gold-containing ring and the copper film.

13. A die paddle for receiving an integrated circuit die in a plastic substrate as claimed in claim 10, wherein the solder resist layer is an epoxy resin layer.

14. A die paddle for receiving an integrated circuit die in a plastic substrate as claimed in claim 10, wherein the plastic substrate comprises epoxy resin.

15. A die paddle for receiving an integrated circuit die in a plastic substrate as claimed in claim 10, wherein the copper film is square.

16. A die paddle for receiving an integrated circuit die in a plastic substrate as claimed in claim 10, wherein the via holes are formed in an array arrangement.

17. A die paddle for receiving an integrated circuit die in a plastic substrate as claimed in claim 10, wherein the openings are formed in an array arrangement.

18. A die paddle for receiving an integrated circuit die in a plastic substrate as claimed in claim 10, wherein the copper film is attached to the central portion of the plastic substrate.

\* \* \* \* \*